(12) United States Patent
Tsujimura et al.

(10) Patent No.: US 6,727,645 B2
(45) Date of Patent: Apr. 27, 2004

(54) ORGANIC LED DEVICE

(75) Inventors: Takatoshi Tsujimura, Fujisawa (JP); Atsushi Tanaka, Moriyama (JP); Kohichi Miwa, Yokohama (JP); Mitsuo Morooka, Kawasaki (JP)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 10/350,215

(22) Filed: Jan. 23, 2003

(65) Prior Publication Data

US 2003/0146711 A1 Aug. 7, 2003

(30) Foreign Application Priority Data

May 24, 2002 (JP) ........................................ 2002-150386

(51) Int. Cl.[7] .............................................. H01L 33/00
(52) U.S. Cl. ............................ 313/504; 257/40; 257/59
(58) Field of Search ..................... 257/40, 59; 313/503, 313/504

(56) References Cited

U.S. PATENT DOCUMENTS 6,150,668 A * 11/2000 Bao et al. ...................... 257/40

* cited by examiner

*Primary Examiner*—David Hung Vu
(74) *Attorney, Agent, or Firm*—Arthur J. Samodovitz (57) ABSTRACT

An organic LED device comprises a substrate, a first driver TFT on the substrate, a second driver TFT on said substrate, and an insulating film on the substrate, the first driver TFT and the second driver TFT. There is a common anode on the insulating film. A first organic LED element is on a first portion of the anode and configured as a top emission struction, and a second organic LED element is on a second portion of the anode and configured as a top emission structure. A first cathode extends into the insulating film and electrically connects the first LED element with the first driver TFT. A second cathode extends into the insulating film and electrically connects the second LED element with the second driver TFT.

10 Claims, 9 Drawing Sheets

ORGANIC LED DEVICE

BACKGROUND OF THE INVENTION

The present invention relates generally to an organic LED device, and more specifically to a top emission organic LED device suitable for significant screen size.

Figure 9:
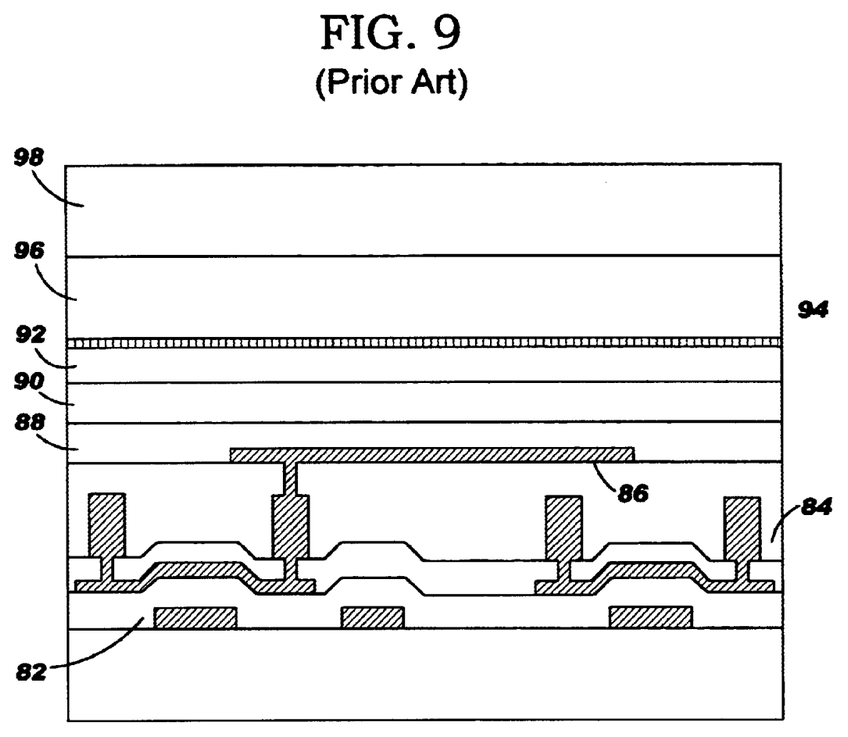
FIG. 9 is a cross-sectional view of a top emission organic LED device according to the Prior Art.

Organic LEDs are well known today. When used in a planar display device, they can be driven by an active matrix drive method such as previously used for a liquid crystal display device. The active matrix deive can be used for a top emission structure or a bottom emission structure. FIG. 9 is a cross-sectional view of an organic LED device using the top emission structure according to the Prior Art. The organic LED device shown in FIG. 9 comprises a thin film transistor (TFT) structure 82 formed of p-type doped poly-crystalline silicon (poly-Si) on a glass substrate. The TFT structure 82 is insulated from an upper structure by an insulating film 84. A reflective metal anode 86 (such as molybdenum (Mo), nickel (Ni) and platinum (Pt)) is formed on an upper portion of the insulating film 84. A hole injection layer 88 is formed on an adjacent and upper layer of the reflective anode 86. A hole transport layer 90 and an electron transport layer 92 are formed on an upper layer of the hole injection layer. A translucent cathode 94 is formed on an upper layer of the electron transport layer 92. This cathode 94 transmits a light beam generated by the organic LED therethrough and also supplies electrons. For example, the cathode 94 can be formed of a material having a small work function, such as aluminum (Al), sodium (Na), calcium (Ca), magnesium-silver (MgAg), barium (Ba) and strontium (Sr). A buffer layer 96 and a glass protective layer 98 are formed on the cathode 94. Thus, the top emission structure is formed.

The top emission type organic LED device shown in FIG. 9 is more efficient than the bottom emission type in that an aperture ratio can be improved without depending on the dimension of the TFT. However, the top emission type requires the very thin cathode 94 (about 10 nm) film in order to impart a transparency thereto. Therefore, the cathode 94 has has a disadvantage of being inevitably high in resistance. Because cathode 94 is high in resistance there is significant deop in cathode voltage. This increases from an end portion of a screen to a center portion thereof. Therefore, as the area of the organic LED device becomes larger, it is difficult to apply a sufficient voltage for driving the TFT from the end portion of the screen to the center portion of the screen. In order to reduce the voltage drop through the above-described cathode 94, it is possible to add a low-resistance layer such as ITO, IZO, $SnO_x$, and $InO_x$ on the cathode 94. Nevertheless, the ITO has some resistance. Therefore, when a large screen, for example ten inches, uses top emission organic LEDs it is difficult to provide an even level of intensity across the screen.

Figure 10:
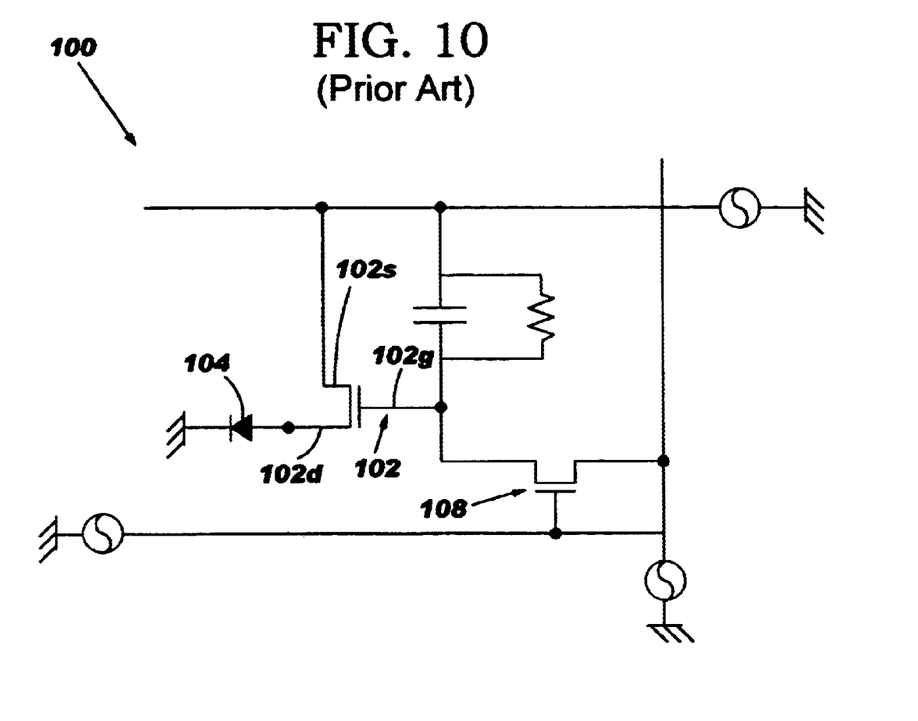
FIG. 10 is a driver circuit of an organic LED device of a cathode-common structure according to the Prior Art.

FIG. 10 shows a Prior Art driver circuit 100 of a cathode-common mode, which uses a p-type driver TFT 102 and is used for driving the top emission organic LEDs. A drain electrode 102d of the driver TFT 102 is connected to an organic LED element 104, a source electrode 102s is set at a common potential, and the driver circuit 100 is driven in the cathode-common mode. A gate electrode 102g of the driver TFT is connected to a switching TFT 108 to permit selective driving of the organic LED element 104. The Ids current between the source and drain of the driver TFT 102 in a saturation region thereof is approximately proportional to $(Vgs-Vth)^2$ in the top emission structure shown in FIG. 10. "Vgs" is a voltage between the gate and the source, and "Vth" is a threshold voltage. Because Ids is given by a function only of the Vgs in the conventional top emission structure, the cathode-common mode is adopted. Variation of the Vgs of the TFT is accomodated by characteristic variation of the organic LED.

The following Table 1 lists the types of TFTs that can be used for preventing the change of the Vgs following the characteristic variation of the organic LED. In Table 1, a reference symbol "circle" denotes types that can accomodate the characteristic variation of the organic LED element, and a reference symbol "cross" denotes types that are not capable of accomodating the characteristic variation of the organic LED element.

TABLE 1

| | Anode-common | Cathode-common |
|---|---|---|
| n-type TFT | "circle" | "cross" |
| p-type TFT | "cross" | "circle" |

Even if any of the n-type TFT or the p-type TFT are used, the characteristic variation of the organic LED element can be accomodated by any of the anode-common mode and the cathode-common mode, respectively, when consideration is made only for that characteristic variation as described above. However, another disadvantage (as described below) will occur in the case of forming an anode-common structure by use of the n-type TFT as the driver TFT.

Figure 11:
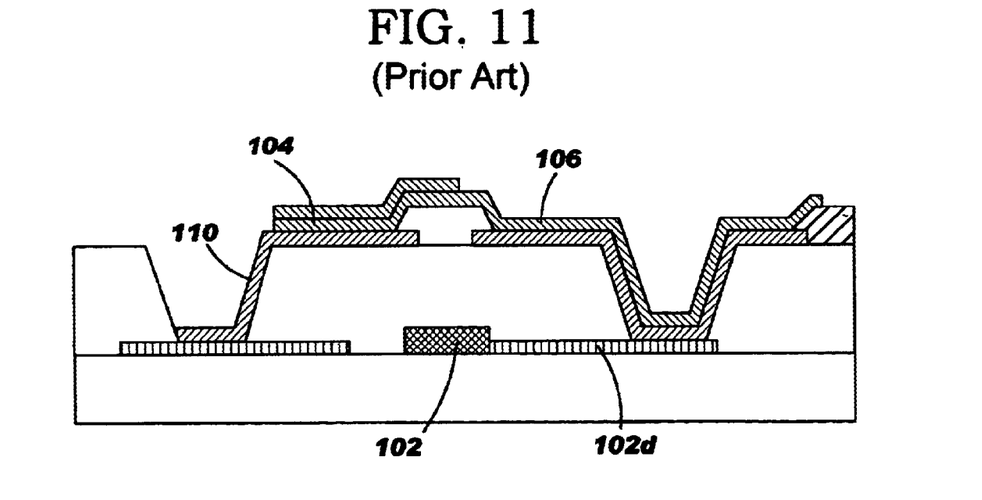
FIG. 11 is a cross-sectional view of a semiconductor structure of a driver circuit for a conventional organic LED device having an anode-common structure using an n-type doped TFT, according to the Prior Art.

FIG. 11 shows a cross-sectional structure of the driver circuit of FIG. 10 where the anode-common structure is formed by the n-type driver TFT 102. The pixel also comprises switching TFT 108, an anode 110, a cathode 106 and LED element 104. In the conventional top emission structure, the resistive cathode cannot be arranged as a lower electrode because the injection efficiency and light emission efficiency are significantly lowered. Therefore, in the case of forming the top emission structure by adopting the anode-common structure using the n-type TFT, as shown in FIG. 11, it becomes necessary to form a contact hole for anode 110 and cathode 106 in each pixel. This lowers the aperture ratio in the pixel of the organic LED element 108 which is undesirable. Such contact holes are not efficienct or productive and add to the cost. On the other hand, the cathode-common mode using the n-type TFT cannot restrict the variation of the Vgs following the characteristic variation of the organic LED and is inferior in display characteristics.

Accordingly, an object of the present invention is to provide a top emission organic LED device with a less expensive construction than prior art devices.

Another object of the present invention is to provide a top emission organic LED device for a wide screen.

Another object of the present invention is to provide a to emission organic LED device of the foregoing type which has a high aperature ration.

SUMMARY OF THE INVENTION

The invention resides in an organic LED device comprising a substrate, a first driver TFT on the substrate, a second driver TFT on said substrate, and an insulating film on the substrate, the first driver TFT and the second driver TFT. There is a common anode on the insulating film. A first organic LED element is on a first portion of the anode and configured as a top emission struction, and a second organic LED element is on a second portion of the anode and configured as a top emission structure. A first cathode extends into the insulating film and electrically connects the first LED element with the first driver TFT. A second cathode extends into the insulating film and electrically connects the second LED element with the second driver TFT.

There are other features of the present invention. For example, N-type driver TFTs are used in the top emission structure. It was found that by adopting the anode-common structure in the organic LED device using the n-type driver TFT, an influence of the characteristic variation of the organic LED element to the Vgs can be minimized, and the characteristics can be stabilized. Also, the anode is planar and formed of a low-resistance material such as Al, Ni and Co. By use of this type of anode the common electrode connected to the plurality of pixels is lowered in resistance, thus making it possible to provide the organic LED device of a large area. The anode is formed as lines or a plane, thus making it possible to use the anode as the common electrode. The common anode configuration simplifies the manufacturing process.

It is preferable that the driver TFT include any of n-type amorphous silicon and n-type polycrystalline silicon as an active layer. It is also preferable that the organic LED device include at least a light emitting portion and an electron transport portion, a part of each being formed self-consistently.

BRIEF DESCRIPTION OF THE DRAWINGS

FIG. 3 (a–e) are cross-sectional views showing a process for manufacturing the organic LED device of the present invention.

FIG. 4 (a–c) are cross-sectional views showing a process for manufacturing the organic LED device of the present invention.

DETAILED DESCRIPTION OF THE PREFERRED EMBODIMENTS

Figure 1:
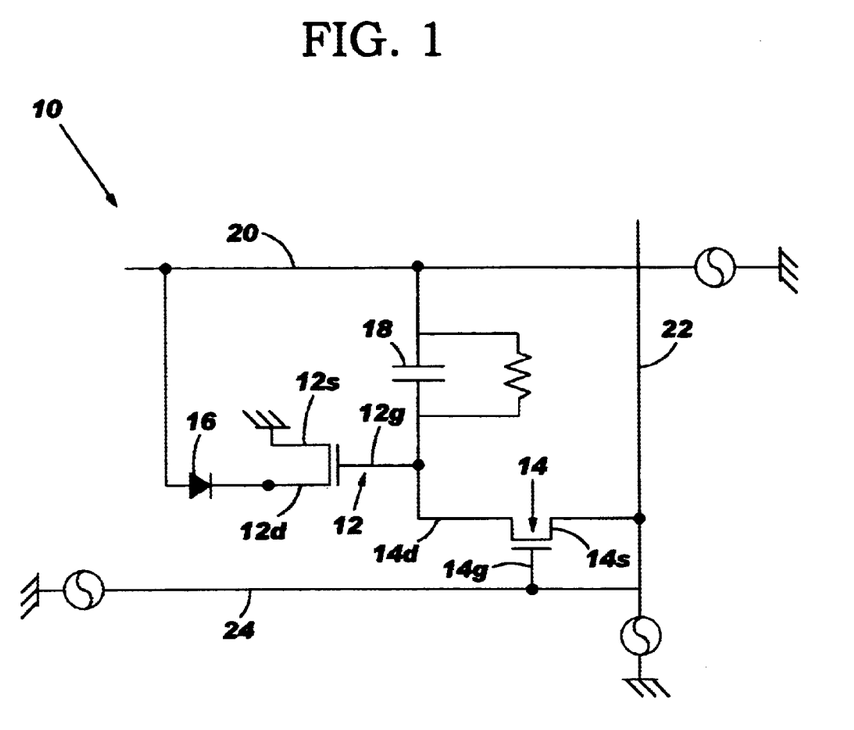
FIG. 1 is a driver circuit of an organic LED device of the present invention.

Although the present invention is described below in detail based on an embodiment shown in the drawings, the present invention is not limited to this embodiment. FIG. 1 shows a driver circuit of an organic LED device 10 adopting an anode-common structure, according to the present invention. In the preferred embodiment, both the driver TFT 12 and the switching TFT 14 are made as n-type doped. The n-type driver TFT 12 and an n-type switching TFT 14 are connected to drive an organic LED element 16. However, it is also possible to form the driver TFT 12 and the switching TFT 14 from different dope types (i.e. one p-type and the other n-type). As illustrated in FIG. 1, a gate electrode 12g of the driver TFT 12 is connected to a common electrode 20 through a capacitor 18. A drain electrode 12d of the driver TFT 12 is connected to a cathode of the organic LED element 16. A source electrode 12s of the driver TFT 12 is grounded. The anode of LED 16 is common to the anodes of the other, similar LEDs (not shown) in the screen. Consequently, an anode-common structure is formed.

The gate electrode 12g of the driver TFT 12 is also connected to a drain electrode 14d of the switching TFT 14. A source electrode 14s thereof is connected to a data line 22. A gate electrode 14g thereof is connected to a selection line 24. Thus, the organic LED element 16 is driven by TFTs 12 and 14. The driver circuit shown in FIG. 1 forms one pixel of the organic LED device. A plurality of such pixels are arranged in a plane for an active matrix type drive.

Figure 2:
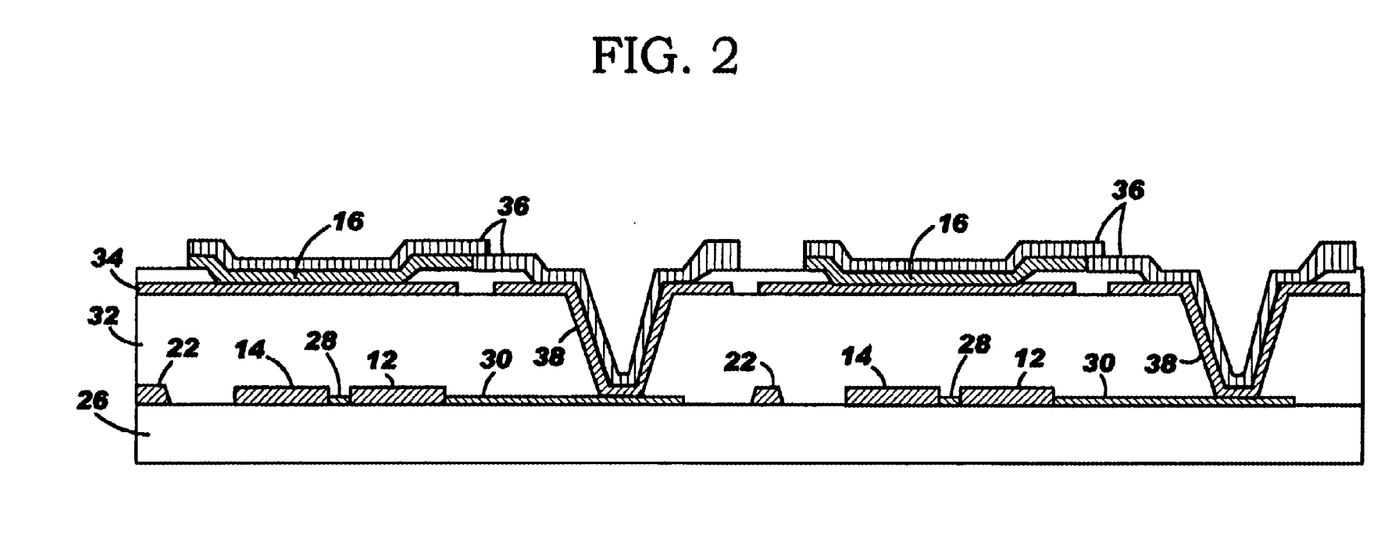
FIG. 2 is a cross-sectional view of the driver circuit of the present invention.
Figure 3A:
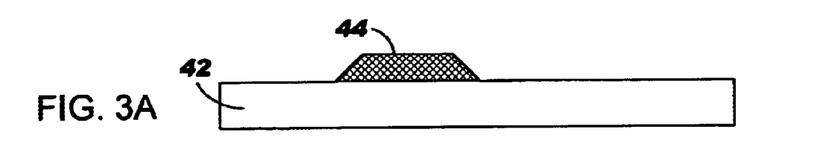
Figure 3B:
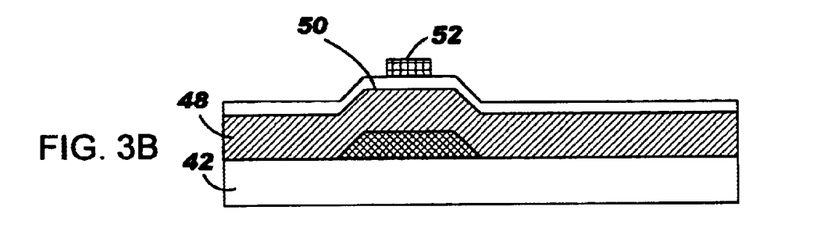
Figure 3C:
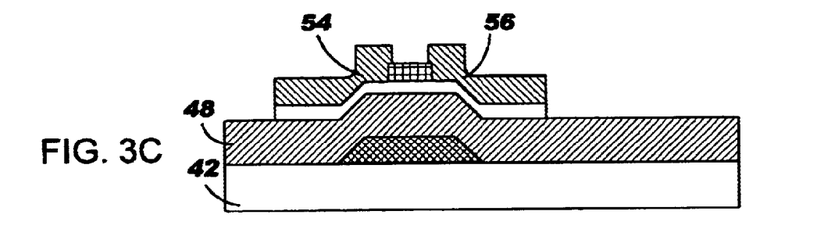
Figure 3D:
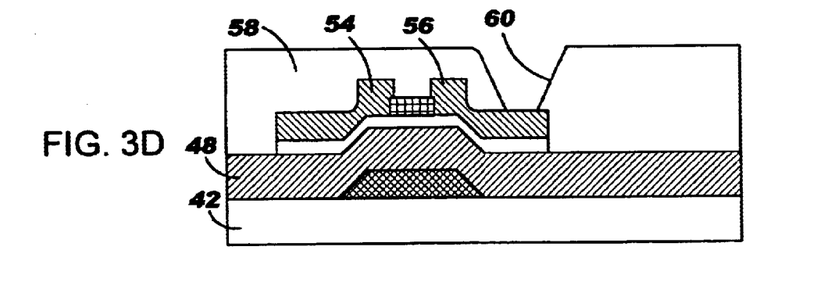
Figure 3E:
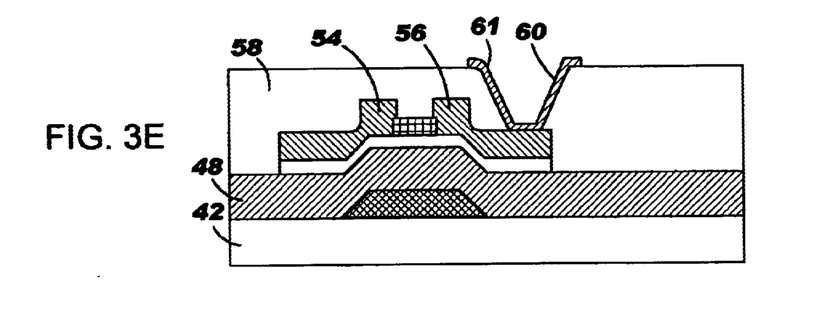

FIG. 2 shows the LED device 10 of FIG. 1 in semiconductor form. The driver circuit of LED device 10 includes the n-type TFTs 12 and 14 shown in FIG. 1. A TFT having any structure that has been known heretofore can be used for the present invention. However, in the present invention, it is necessary to use a TFT including an n-type active layer to implement an anode-common structure. Moreover, it is preferable to form the driver TFT 12 and the switching TFT 14 from the same dope type for the convenience of manufacturing and to maximize productivity. However, functionally, the driver TFT 12 and the switching TFT 14 can be made of different doping types, and the switching TFT 14 can include a p-type active layer. Moreover, an n-type poly-Si or an n-type amorphous silicon (a-Si) can be used for the active layer. However, to restrict characteristic variation associated with the organic LED element 16, a-Si can be effectively used as the n-type active layer.

As shown in FIG. 2, the switching TFT 14 and the driver TFT 12 are formed on a substrate 26. The substrate 26 can be composed of various materials, such as SiOx, SiOxNy, Si and metal oxide. A conductive line 28 on substrate 26 connects the TFTs to each other. Another conductive line 30 on substrate 26 connects the TFTs to a cathode 36. TFTs 12 and 14 are insulated from an upper structure thereof by an insulating film 32 such as a polymer film. Lines are formed on the insulating film 32 by any of a variety of patterning technologies known heretofore. For example, an anode 34 comprising a conductive material such as Al, Mo, Ni and ITO is patterned on the insulating film as lines or a plane. The anode 34 lines or plane reside in the same level as a common electrode (not shown). Moreover, anode 34 is connected to another anode of another pixel (similar to LED element 16 but not shown) and drives the organic LED element 16 in the anode-common mode. The cathode 36 is insulated from the anode 34 by the organic LED element 16, and allows the organic LED element 16 to emit light. Moreover, the cathode 36 is connected through a via hole 38 to the line 30 formed on a lower layer side thereof and connected to the drain electrode 12d of the driver TFT 12.

As a result of the design illustrated in FIG. 2, an aperture ratio of the organic LED device is increased because no contact holes are formed in the cathode 36 and the anode 34, respectively. Moreover, the anode 34 is connected through the common electrode to other pixels easily. These other pixels have the same-construction as pixel 10. Moreover, because the anode 34 can be formed from a metal plane or lines, the anode 34 can be low in resistance. Therefore, the present invention does not cause a significant voltage drop from an end portion of a screen to a center portion thereof, thus making it possible to enlarge the screen.

FIG. 3 (*a–e*) shows a method of manufacturing the organic LED device of the present invention. As shown in FIG. 3(*a*), a gate electrode 44 and a line (not shown) for sending a data signal are patterned on an insulating substrate 42. Next, as shown in FIG. 3(*b*), a gate insulating film 48 composed of a material such as SiNx, SiOy and SiOxNy and an active layer 50 composed of poly-Si or a-Si are deposited, and a channel protective layer (etching stopper) 52 is patterned. Next, as shown in FIG. 3(*c*), a source electrode 54 and a drain electrode 56, each comprising Mo/Al/Mo, are patterned. Next, as shown in FIG. 3(*d*), an insulating film 58 such as SiNx is deposited, and a contact hole 60 is formed in the insulating film 58. Next, as shown in FIG. 3(*e*), a connection element 61 composed of a conducting film such as ITO is formed, which is connected to upper wiring to be described later. Although this connection element 61 can be-omitted, formation thereof is desirable in order to obtain a good electric connection between the driver TFT on the lower layer side and the organic LED element on the upper layer side.

Figures 4, 4A:
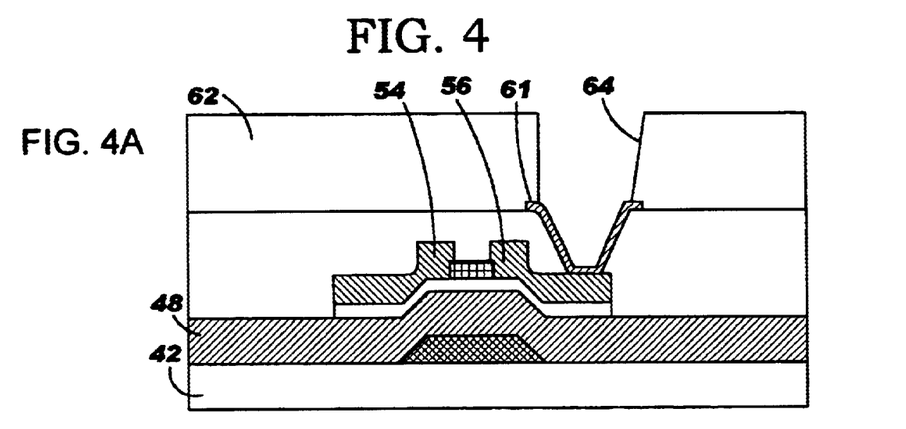
Figure 4B:
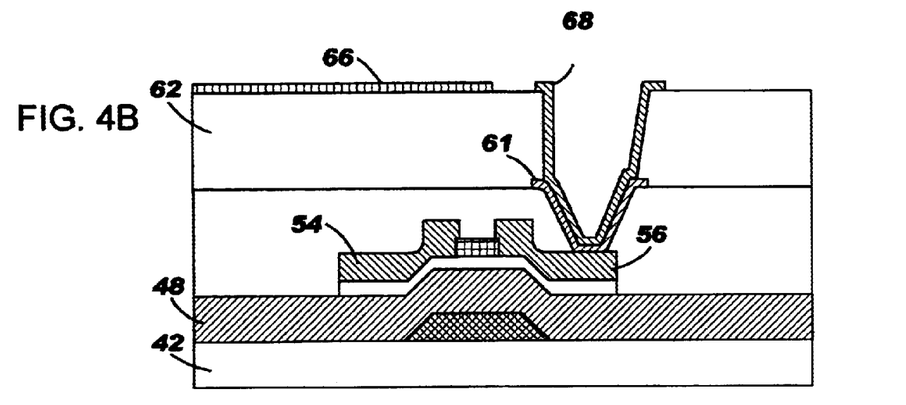
Figure 4C:
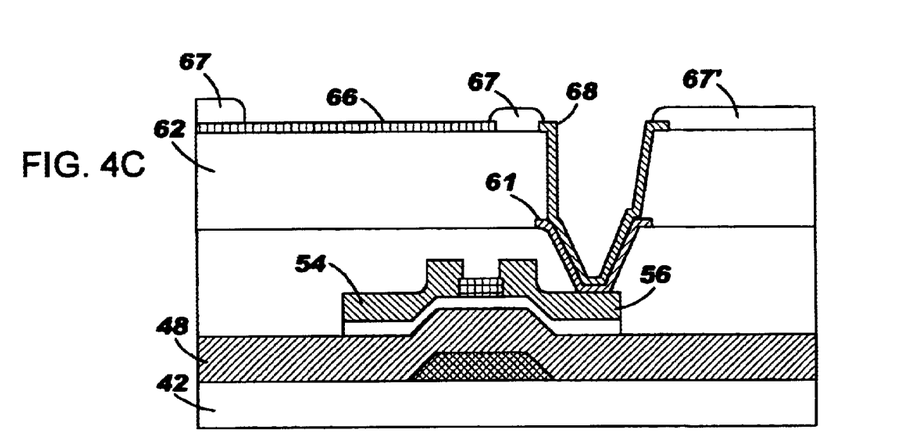

FIG. 4 shows manufacturing process steps subsequent to those shown in FIG. 3. As shown in FIG. 4(*a*), a polymer insulating film 62 is deposited on the structure formed in the process shown in FIG. 3(*e*), and an aperture 64 corresponding to the contact hole 60 is formed. Next, as shown in FIG. 4(*b*), a layer of a conductive material such as ITO, Mo and ITO/Mo is formed. This layer of the conductive material is patterned, and-thus an anode 66 for the organic LED element, which is shown in FIG. 4(*b*), is formed. Also, a connection element 68 for stabilizing electric connectivity of the cathode to the driver TFT formed on the lower layer side is simultaneously formed on the inner side surfaces of the contact hole 60 and the aperture 64. Although this connection element 68 can also be omitted, it is desirable to form the connection element 68 for the same reason as described above. Next, as shown in FIG. 4(*c*), an organic or inorganic insulating film 67 for insulating the organic LED element and the other structures from each other is deposited and patterned, and thus a region for forming the organic LED element is formed. A portion 67' that is not related to demarcation of the organic LED element can be removed. However, it is not necessary to remove the portion 67' as long as it does not affect the function of the organic LED device.

Figure 5:
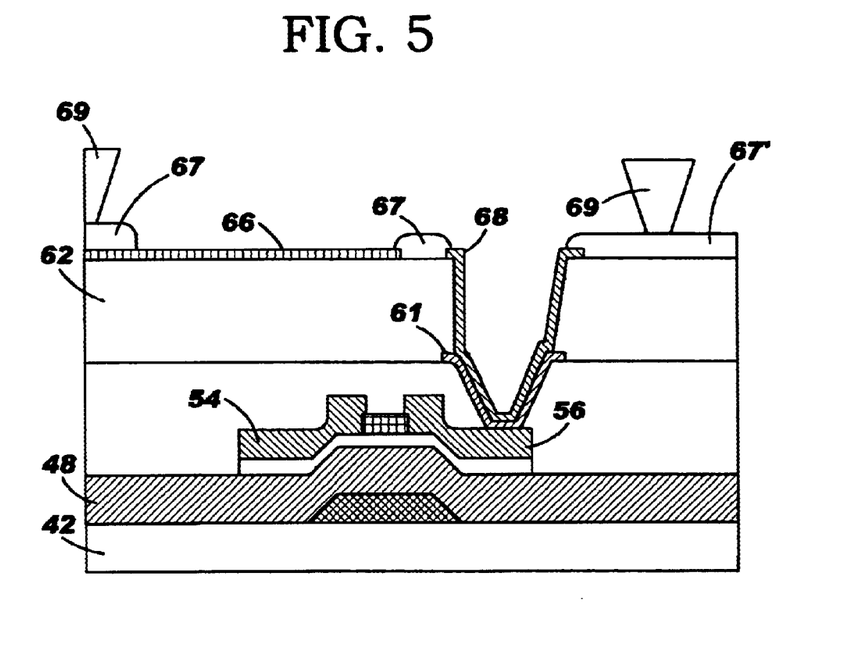
FIG. 5 is a cross-sectional view showing a process for manufacturing the organic LED device of the present invention.

FIG. 5 shows a preprocessing process for forming the organic LED device. A polymer masking film such as photoresist is utilized to pattern a protruding structure 69 adjacent to a region where the organic LED element is formed. Preferably, protruding structure 69 has an overhang as shown in FIG. 5. However, as long as the organic LED element of the present invention is obtained efficiently, the protruding structure 69 can be shaped in any form. Protruding structure 69 is used for forming at least three sides of the respective layers such as a light emitting portion and an electron transport portion, which constitute the organic LED element, together with a shadow mask "M" in a process to be described later. Moreover, the protruding structure 69 prevents the shadow mask from being applied with excessive heat during a deposition process such as evaporation of the organic LED element, and thus can enhance reusability of the shadow mask.

Figure 6:
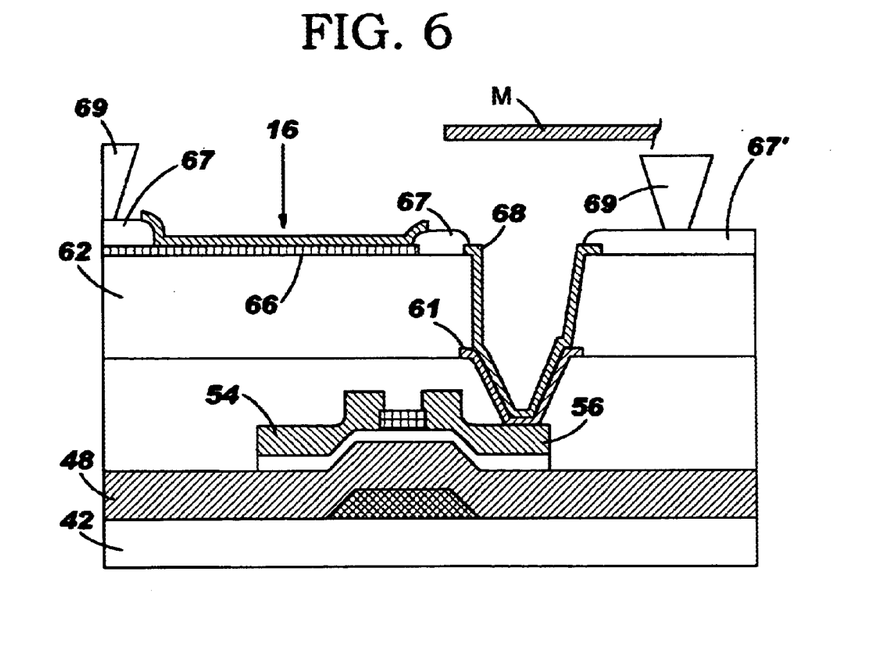
FIG. 6 is a cross-sectional view showing a process for manufacturing the organic LED device of the present invention.

Next, as shown in FIG. 6, the organic LED element 16 is deposited by use of a suitable deposition technology such as evaporation while protecting the other regions by use of a shadow mask M. This organic LED element is constituted by including layers such as a hole injection layer, a light emitting layer and an electron transport layer on the exposed anode electrode 66. In this case, the thickness of the organic LED element can be set appropriately, for example in a range from 100 nm to 200 nm. Various dopants, organic or inorganic, such as ruburen and coumarin, can be added to the above-described respective layers in order to improve light emission efficiency.

Figure 7:
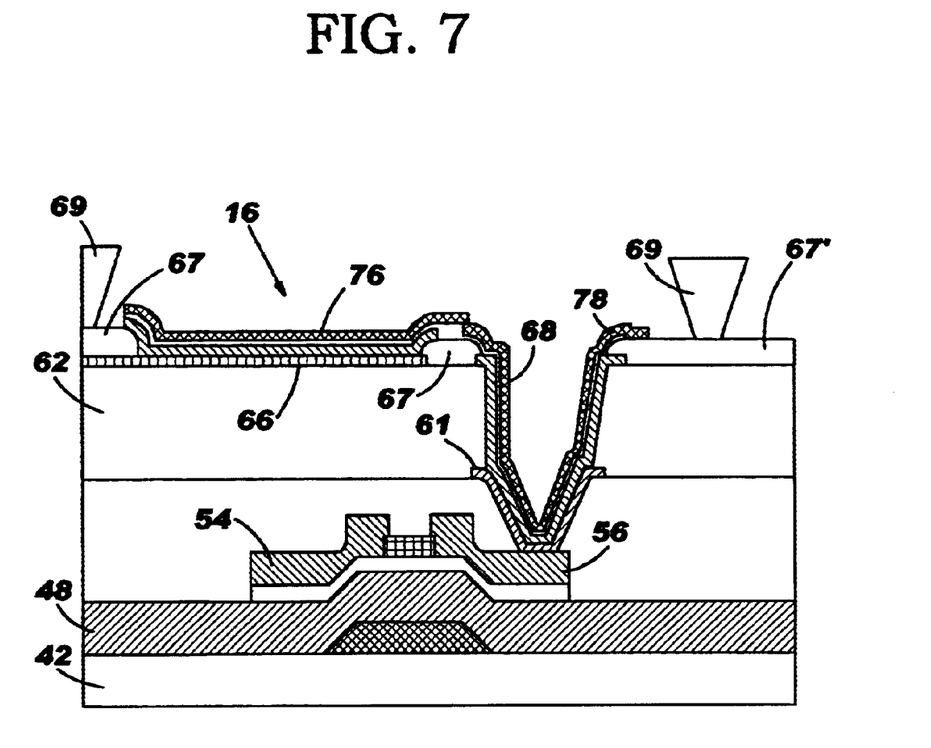
FIG. 7 is a cross-sectional view showing a process for manufacturing the organic LED device of the present invention.

The shadow mask M shown in FIG. 6 can form end portions at least in three directions of the organic LED element 16 together with the protruding structure 69 while protecting the lower structure thereof. When forming a color display device, patterning is required by use of shadow masks corresponding to the respective colors of R, G and B. The pixels are shifted for each color. Next, in the manufacturing process, as shown in FIG. 7, the cathode 76 is patterned from a material having a smaller work function, such as MgAg, AlLi, so as to coat the organic LED element and the other structures, which are formed as shown in FIG. 6. As described above, the cathode is formed as a very thin film in order to impart a transparency thereto. To prevent the thin cathode from becoming discontinuous and unstable, a transparent conductive film such as ITO is adhered onto the cathode for the purpose of supplementing conductivity as the cathode and protecting such an unstable material having a small work function. Subsequently, a passivation film 78 formed of a material such as SiNx is further deposited for protecting the respective structures. Thus the organic LED device 10 according to the present invention is formed.

Protruding structure 69 surrounds the organic LED element. Therefore, it becomes possible to form such elements as the cathode 76 and the ITO film on the organic LED element by use of the protruding structure 69 after forming the organic LED element. Moreover, because the protruding structure 69 includes the overhang, the adjacent pixels can be securely insulated from each other simultaneously. Consequently, it is unnecessary to form the pattern by use of the shadow mask when depositing the cathode 76, thus making it possible to improve the efficiency of the manufacturing processes significantly. Thereafter, the passivation film is deposited.

Figure 8:
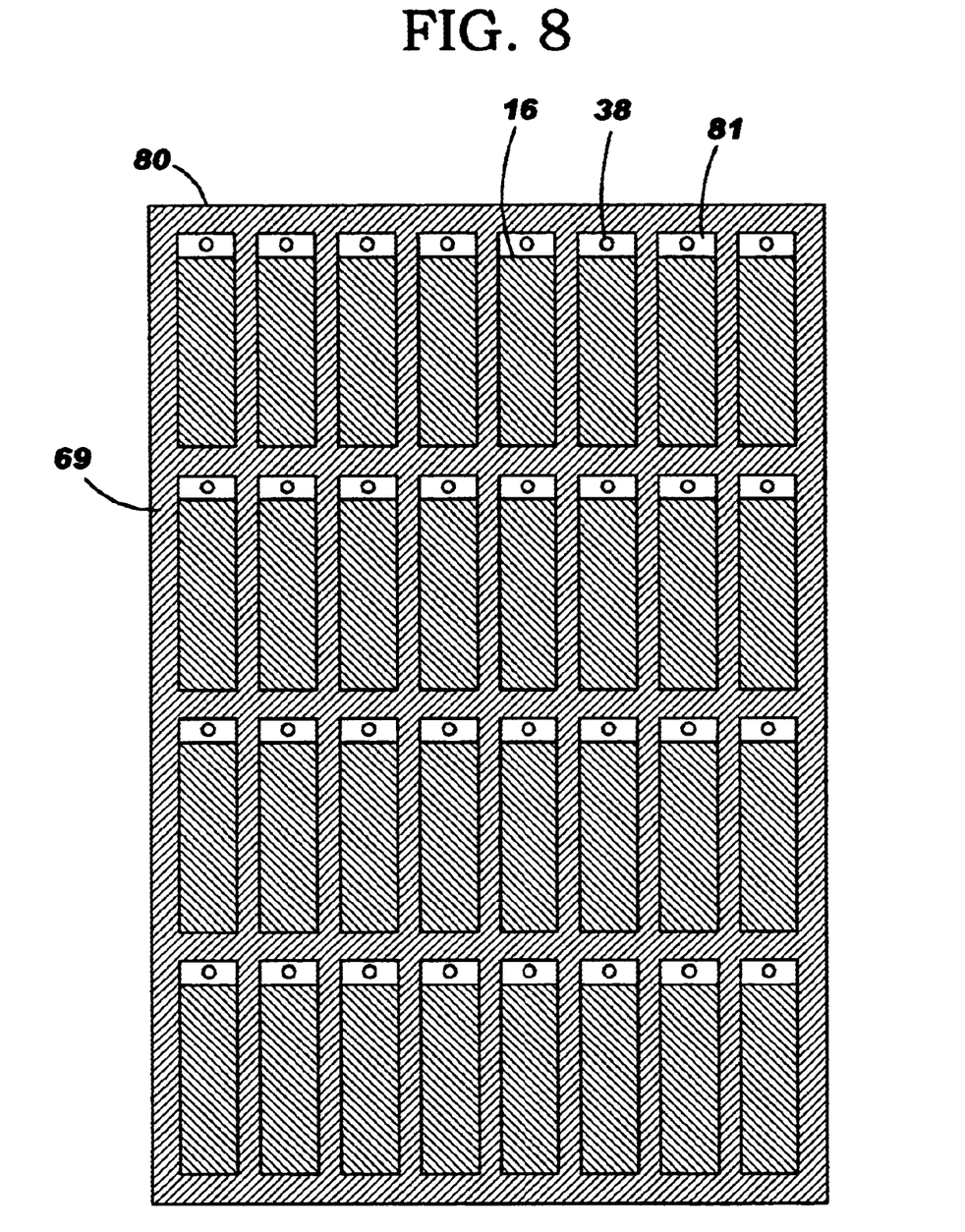
FIG. 8 is a plan view of the organic LED device manufactured according to the present invention.

FIG. 8 is a plan view of a TFT substrate 80 according to the present invention. In the TFT substrate shown in FIG. 8, a plurality of pixels 81 are formed adjacent to one another. One pixel is formed in a region surrounded by the protruding structure 69. The organic LED element 16 and the contact hole 38 shown in FIG. 2 are formed in the inside of the region surrounded by the protruding structure 69. (Within the contact hole 38, the aperture 64 is coated with the connection element 68.) The cathode and the passivation film, which are formed on the upper portion of the organic LED element 16, are formed by use of the protruding structure 69 in the region in the inside of the protruding structure 69.

As shown in FIG. 6, the upstream side of the overhang of the protruding structure 69 in the deposition process is wider than the downstream side. Therefore, the end portion of the organic LED element 16 on the side adjacent to the protruding structure 69 can be formed self-consistently. Moreover, the manufacturing cost is lowered because the upper structure can also be formed self-consistently by the protruding structure 69.

It is preferable to remove the protruding structure 69 after the process illustrated in FIG. 7. However, if desired, the protruding structure 69 can be left in provided there is no impediment in the subsequent manufacturing processes and resultant device characteristics. The passivation film may be formed after removing the protruding structure 69.

Although description has been made above for the present invention based on the embodiment shown in the drawings, the present invention is not limited to the embodiment shown in the drawings. The structure, material, order of the manufacturing processes and the like of the organic LED element, can be varied as long as a similar structure is obtained.

What is claimed is:

1. An organic LED device comprising:
   a substrate;
   a first driver TFT on said substrate;
   a second driver TFT on said substrate;
   an insulating film on said substrate, said first driver TFT and said second driver TFT;
   a common anode on said insulating film;
   a first organic LED element on a first portion of said anode;
   a second organic LED element on a second portion of said anode;
   a first cathode extending into said insulating film and electrically connecting said first LED element with said first driver TFT; and
   a second cathode extending into said insulating film and electrically connecting said second LED element with said second driver TFT.

2. An organic LED device as set forth in claim 1 further comprising an insulating film on said first LED element and said second LED element.

3. An organic LED device as set forth in claim 1 wherein:
   said first cathode comprises a first conductive via hole in said insulating layer and a first conductive layer on said first conductive via hole and extending over said insulating layer to an edge of said first LED element; and
   said second cathode comprises a second conductive via hole in said insulating layer and a second conductive layer on said second conductive via hole and extending over said insulating layer to an edge of said second LED element.

4. An organic LED device as set forth in claim 1 further comprising:
   a first switching TFT on said substrate and electrically connected to said first driver TFT; and
   a second switching TFT on said substrate and electrically connected to said second driver TFT.

5. An organic LED device as set forth in claim 1, wherein said first driver TFT includes an n-type amorphous silicon and an n-type polycrystalline silicon as an active layer; and said second driver TFT includes an n-type amorphous silicon and an n-type polycrystalline silicon as an active layer.

6. An organic LED device as set forth in claim 1 wherein said first organic LED element includes a light emitting portion and an electron transport portion, each including a portion formed in a self-aligned manner.

7. An organic LED device as set forth in claim 1 wherein said first and second organic LED elements are configured as top emission structures.

8. An organic LED device as set forth in claim 1 further comprising:
   a first overhanging structure protruding above said insulating layer and surrounding said first LED element; and
   a second overhanging structure protruding above said insulating layer and surrounding said second LED element.

9. An organic LED device as set forth in claim 8 wherein said first organic LED element was formed in a self-aligned manner in an inside of said first overhanging structure by an evaporation method, and said second organic LED element was formed in a self-aligned manner in an inside of said second overhanging structure by an evaporation method.

10. An organic LED device as set forth in claim 1 wherein said first driver TFT is n-type and said second driver TFT is n-type.

* * * * *